United States Patent
Fu et al.

[11] Patent Number: 5,530,301
[45] Date of Patent: Jun. 25, 1996

[54] ELECTRONIC DELAY TURN OFF SWITCH

[76] Inventors: Haizhong Fu, 1118 Florence Ave., Evanston, Ill. 60202; Grant V. Baumgardner, P.O. Box 295, Lompton, Ill. 61318

[21] Appl. No.: 254,748
[22] Filed: Jun. 6, 1994
[51] Int. Cl.⁶ .................................................. H01H 7/00
[52] U.S. Cl. .................... 307/141; 315/199; 315/360
[58] Field of Search .................... 307/125, 139, 307/140, 141, 141.4, 112, 113, 116; 315/360, 362, 194, 199; 323/265, 282; 327/447, 448, 419

[56] References Cited

U.S. PATENT DOCUMENTS

| | | | |
|---|---|---|---|
| Re. 33,504 | 12/1990 | Yuhasz et al. | 307/115 |
| 3,732,484 | 5/1973 | McKenna | 323/19 |
| 4,082,961 | 4/1978 | Genuit | 307/141 |
| 4,339,696 | 7/1982 | Jabor | 315/360 |
| 4,494,012 | 1/1985 | Coker | 307/141 |
| 4,500,795 | 2/1985 | Hochstein et al. | 307/141 |
| 4,591,781 | 5/1986 | Larson | 323/323 |
| 4,766,331 | 8/1988 | Flegel et al. | 307/141 |
| 4,775,801 | 10/1988 | Baum | 307/141 |
| 4,912,376 | 3/1990 | Strick | 315/362 |
| 5,051,607 | 9/1991 | Dalton | 307/141 |
| 5,258,656 | 11/1993 | Pawlick | 307/141 |

*Primary Examiner*—Jonathan Wysocki
*Assistant Examiner*—Jonathon S. Kaplan

[57] ABSTRACT

An electronic delay turn off switch including a bridgelike array of four diodes disposed between an alternating current power source and a load wherein the diodes have anodes and cathodes in opposing disposition and having an SCR with anode connected to the interconnected cathodes and with cathode connected to the interconnected anodes. A gate isolation diode, a switch, a resistor-capacitor charge mode timer, and a DIAC are interconnected between the SCR anode and gate thereby providing an SCR turn on whenever the switch contacts are closed, and a delayed SCR turn off whenever the switch contacts are opened. In an alternate embodiment a variable resistor is added to enable user selection of the duration of turn off delay.

1 Claim, 4 Drawing Sheets

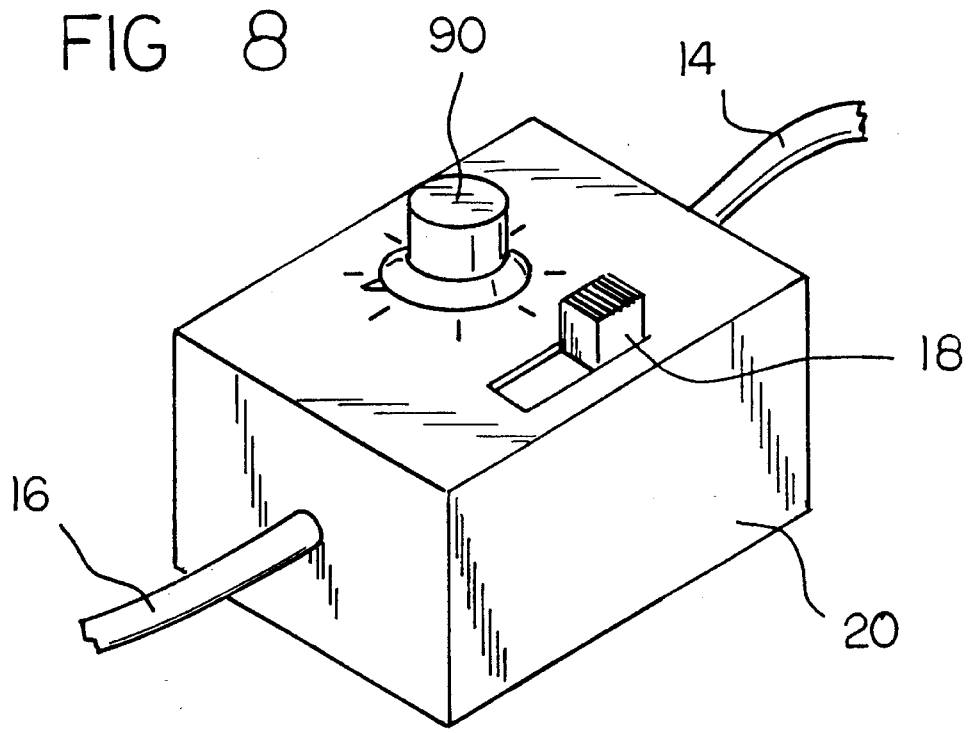
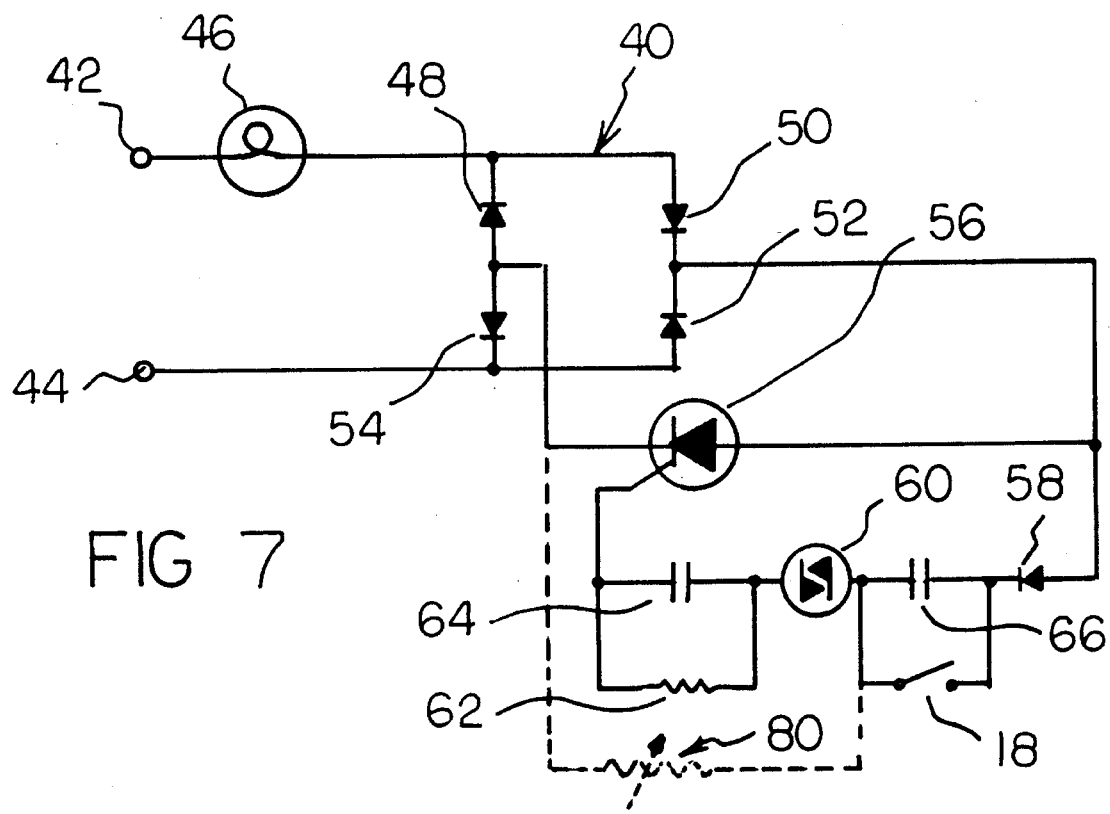

ELECTRONIC DELAY TURN OFF SWITCH

BACKGROUND OF THE INVENTION

Field of the Invention

The present invention relates to electrical switches and more particularly pertains to an electronic delay turn off switch which may be employed to apply or remove electrical power from lights, appliances, or other forms of electrically powered equipments using an alternating current power source.

Description of the Prior Art

The use of delayed and timer controlled electrical switching is known in the prior art. More specifically, delaying switches heretofore devised and utilized for delayed switch turn off are known to consist basically of familiar, expected and obvious structural configurations, notwithstanding the myriad of designs encompassed by the crowded prior art which have been developed for the fulfillment of countless objectives and requirements.

The present invention is directed to improving devices for an electronic delay turn off switch in a manner which is safe, secure, economical and aesthetically pleasing.

For example, U.S. Pat. No. 4,912,376 to Strick discloses a timed actuator for conventional wall switch. The Strick invention comprises a battery powered appliance affixed to an existing toggle style wall switch wherein a timer, control circuitry, and an electrical motor are powered. The Strick invention employs a switch lever engaging mechanism which is powered by the motor upon command from the timer and control circuitry thereby providing a timed on and off cycle. The present invention employs electronic components and does not require any electromechanical devices, and furthermore there is no requirement for an existing switch.

In U.S. Pat. No. 5,051,607 to Dalton a switch time delay apparatus is disclosed wherein an electronic time delay is connected in parallel with a single pole switch connected to an alternating current source and load. The Dalton invention employs a voltage comparator, two timers, an optoisolator, and a TRIAC switch. A combination of the aforementioned electronic components circuitry detects the duration of an on-off toggle of the single pole switch. If the single pole switch is toggled slowly the circuitry provides simple on and off functions as would be experienced by the single pole switch alone. However, if the single pole switch is toggled rapidly terminating in the off position a timer provides a latching signal to the TRIAC gate and the load receives power through the TRIAC. The present invention does not employ a single pole switch or TRIAC in the source-load circuit rather an SCR is employed to controllably direct current to the load. The present invention requires no integrated circuits such as comparators, timers, or optoisolators and employs only a few discrete electronic circuit elements.

In U.S. Pat. No. 4,494,012 to Coker a switch timer 100 is described wherein an electronic circuit 102 is interconnected with manual switch 104 in line with a load 106 thereby providing a selectable on state, off state, or delayed turn off state. See FIG. 1. Input power provided to manual switch 104 bypasses electronic circuit 102 when an on state is selected. The Coker invention is interconnectedly disposed within the line high side and is additionally maintained unpowered whenever switch 104 is in the off state. Delay times in the Coker invention are predetermined by an integrated circuit timer, and the electronic switching means controlling delayed load turnoff comprises a TRIAC. The present invention does not require the disposition of a manual mechanical switch in the line and performs all switching to the load by means of an SCR. In the present invention a low current switch is provided to enable resistor-capacitor charge timing, hereinafter referred to as RC timing, whereby a delayed turn off is achievable. The present invention employs no integrated circuits and uses a minimal number of discrete electronic elements.

In U.S. Pat. No. 4,766,331 to Flegel et al. a timer switch with auxiliary actuator 200 is disclosed for controlling the supply of electricity to an electrical load wherein an auxiliary actuator comprising solenoid 202 is provided to act independently of the timer switch 204 thereby permitting powering the load in response to both timer function and the presence or absence of an outside stimulus provided by sensor 206 in response to conditions such as the appearance of light or particular levels of relative humidity. See FIG. 2. A disadvantage in this prior art lies in a lack of an ability to simply delay the turn off of a load such as a light source when so instructed by an electrical command. The present invention employs no mechanical switches directly interconnecting the line and load and includes no electromechanical timer means. A simple RC timing circuit controls delayed turn off of a load when a low current control switch is opened.

U.S. Pat. No. 4,500,795 to Hochstein et al. discloses an electrical timing control switch delaying the turnoff of a load for a predetermined period. The disclosure teaches a timer controlled TRIAC solid state switch based circuit to conduct line power to the load. The timer is actuated by a pushbutton switch and following a predetermined delay the load is momentarily switched off and on at least once to indicate an impending time out and final load turn off. The timer portion of the Hochstein et al. invention comprises a digital circuit including an integrated circuit binary counter and a plurality of NAND gates which are interconnected to provide the necessary timing sequence. The disclosure makes no provision for exclusive use of inexpensive discrete circuit elements. Furthermore, there are no provisions for operation of the timer without an intercalated direct current power supply. The present invention employs a few discrete active and passive components and is configured to simply remove power to the load after a time period.

In this respect, the electronic delay turn off switch according to the present invention substantially departs from the conventional concepts and designs of the prior art, and in so doing provides an apparatus primarily developed for the purpose of delaying turnoff of a load for a predetermined time period.

Therefore, it can be appreciated that there exists a continuing need for new and improved electronic delay turn off switches which can be employed to control the temporal removal of power from various loads. In this regard, the present invention substantially fulfills this need.

As illustrated by the background art, efforts are continuously being made in an attempt to improve delayed turnoff electrical timers. No prior effort, however, provides the benefits attendant with the present invention. Additionally, the prior patents and commercial techniques do not suggest the present inventive combination of component elements arranged and configured as disclosed and claimed herein.

The present invention achieves its intended purposes, objects, and advantages through a new, useful and unobvious combination of method steps and component elements, with the use of a minimum number of functioning parts, at a reasonable cost to manufacture, and by employing only readily available materials.

SUMMARY OF THE INVENTION

In view of the foregoing disadvantages inherent in the known types of delayed turnoff electrical timers now present in the prior art, the present invention provides an improved electronic delay turn off switch construction wherein the same can be utilized for removing electrical power from various loads after a preselected time elapses. As such, the general purpose of the present invention, which will be described subsequently in greater detail, is to provide a new and improved electronic delay turn off switch apparatus and method which has all the advantages of the prior art delayed turnoff electrical switches and none of the disadvantages.

The invention is defined by the appended claims with the specific embodiment shown in the attached drawings. For the purpose of summarizing the invention, the invention may be incorporated into a diode bridge comprising four diodes interconnected to preclude current flow through any diode element except whenever a cathode of one diode is electrically joined to the anode of another diode by an SCR means. The SCR is triggered for continuous power application to the load by maintaining closure of a switch. Opening the switch begins timing of an RC timer which provides gate current to the SCR until the preselected time is expended at which time the gate signal disappears resulting in SCR turn off upon the next zero crossing of ac line power.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. In as much as the foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the disclosed specific methods and structures may be readily utilized as a basis for modifying or designing other structures for carrying out the same purposes of the present invention. It should be realized by those skilled in the art that such equivalent methods and structures do not depart from the spirit and scope of the invention as set forth in the appended claims.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

Therefore, it is an object of the present invention to provide an improved electronic delay turn off switch which comprises a few discrete electronic components and may be employed with alternating current line power to provided delayed turnoff of various electrical loads.

It is therefore an additional object of the present invention to provide a new and improved electronic delay turn off switch which has all the advantages of the prior art electronic delay turn off switches and none of the disadvantages.

It is another object of the present invention to provide a new and improved electronic delay turn off switch which may be easily and efficiently manufactured and marketed.

It is a further object of the present invention to provide a new and improved electronic delay turn off switch which is of a durable and reliable construction.

An even further object of the present invention is to provide a new and improved electronic delay turn off switch which is susceptible of a low cost of manufacture with regard to both materials and labor, and which accordingly is then susceptible of low prices of sale to the consuming public, thereby making such electronic delay turn off switches economically available to the buying public.

Still yet another object of the present invention is to provide a new and improved electronic delay turn off switch which provides in the apparatuses and methods of the prior art some of the advantages thereof, while simultaneously overcoming some of the disadvantages normally associated therewith.

Still another object of the present invention is to provide a new and improved electronic delay turn off switch which provides selectable delay times ranging to over eight minutes.

Yet another object of the present invention is to provide a new and improved electronic delay turn off switch not requiring the use of load current mechanical switches to perform the power application and removal functions required to achieve delayed load turn off.

Even still another object of the present invention is to provide a new and improved electronic delay turn off switch not requiring an incidental power supply or the use of integrated circuits.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention. The foregoing has outlined some of the more pertinent objects of this invention. These objects should be construed to be merely illustrative of some of the more prominent features and applications of the present invention. Many other beneficial results can be attained by applying the disclosed invention in a different manner or by modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 7 is a circuit diagram of an electronic delay turn off switch showing an optional portion forming an alternate embodiment providing a variably selectable time delay.

FIG. 8 is a perspective view of an alternate embodiment of an electronic delay turn off switch showing the exteriorly accessible control components.

DESCRIPTION OF THE PREFERRED EMBODIMENT

Figure 1:
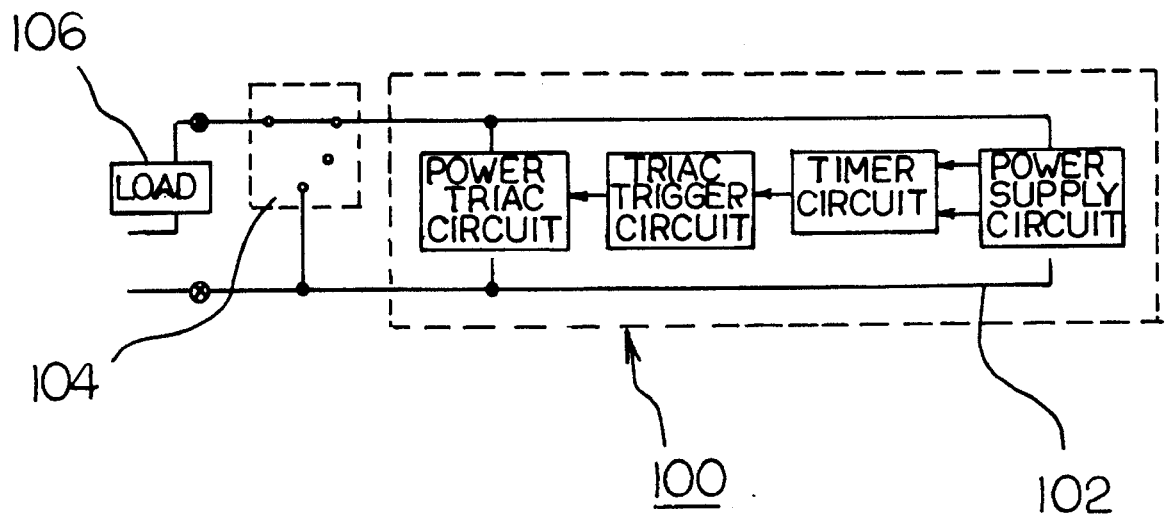
FIG. 1 is a block diagram of the Coker prior art showing the primary circuit functional interconnections.
Figure 2:
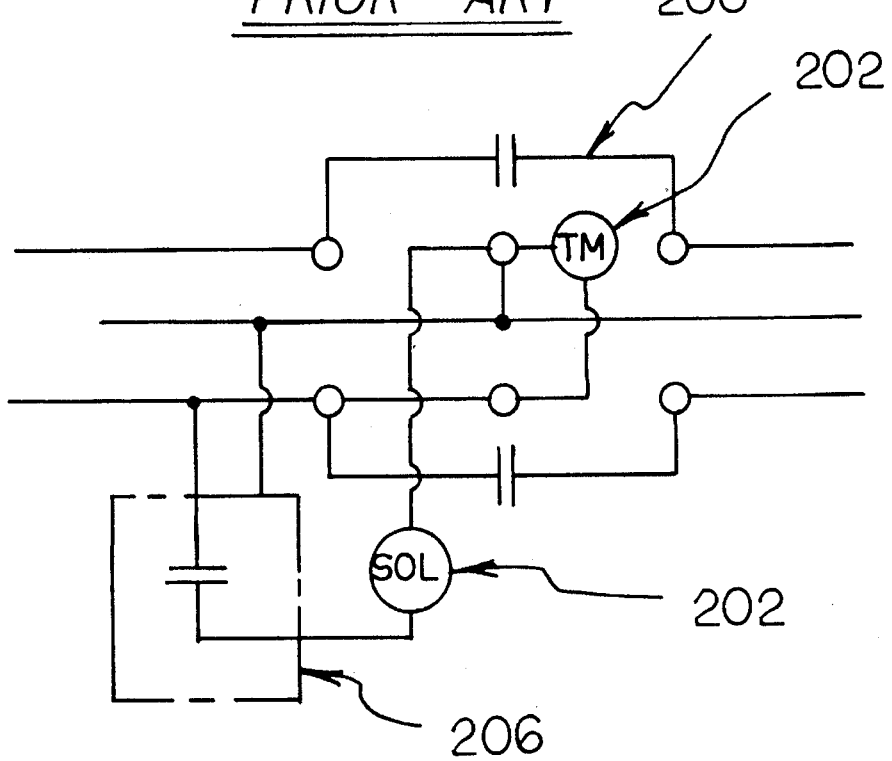
FIG. 2 is an electronic circuit layout of the Flegel et al. prior art showing the interconnection of the timer and actuator portions.

With reference now to the drawings, and in particular to FIG. 1 thereof, a new and improved electronic delay turn off switch embodying the principles and concepts of the present invention and generally designated by the reference numeral 10 will be described.

Figure 3:
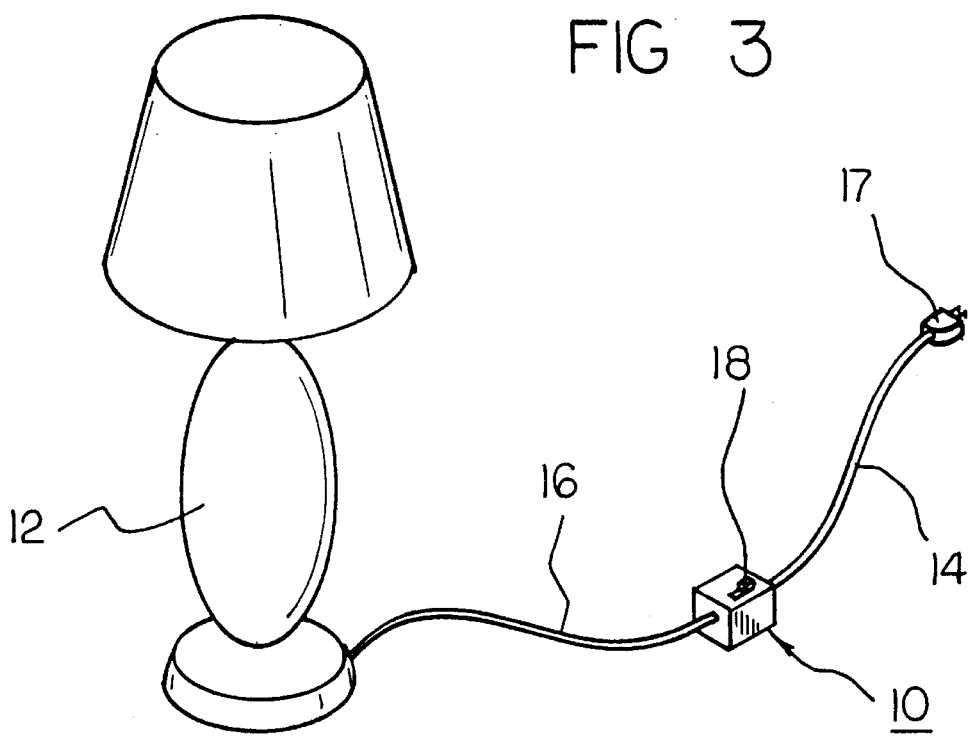
FIG. 3 is a perspective view of the electronic delay turn off switch showing a disposition to achieve delayed turn off of an electrical lamp.

From an overview standpoint, the electronic delay turn off switch is adapted for use with electrical equipment including electric lights which are powereable by alternating electrical current. See FIG. 3. Electronic delay turn off switch 10 is generally connected in a series disposition with an electrical load such as lamp 12 and a power source by power delivery conductors 14 and load interconnecting conductors 16. Power is applied to the electronic delay turn off switch 10 using wallplug 17 which interfaces with conventional wall outlets. Switch 18 is a low current single pole single throw type switch having an off position and an on position. Switch 18 may be operated to turn on lamp 12 and when switch 18 is change to the off position lamp 12 remains in an on state for a predetermined period.

Figure 4:
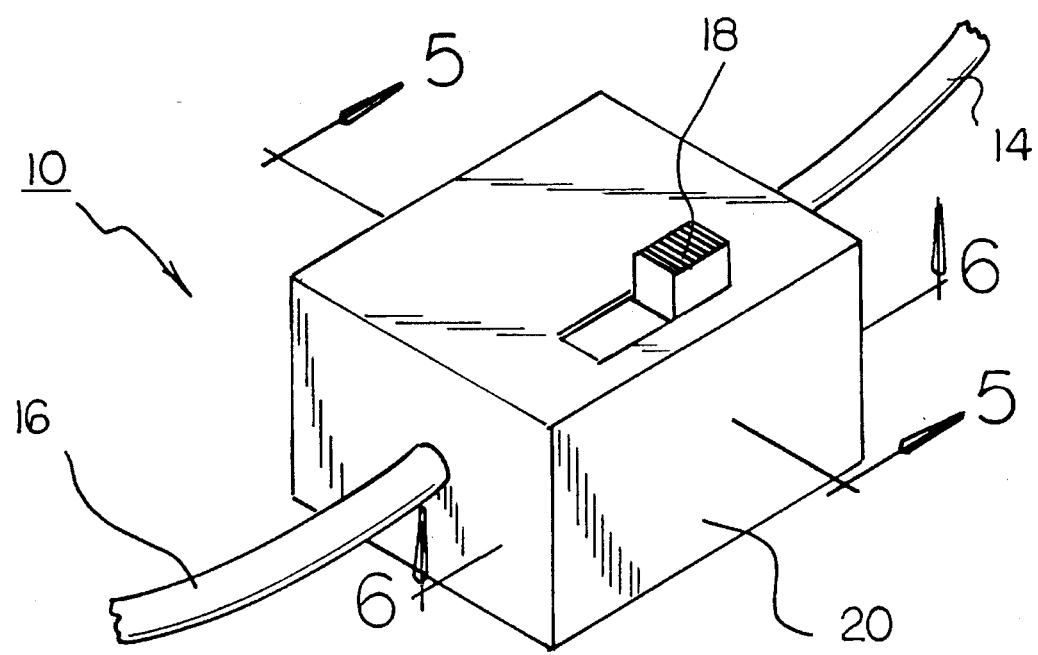
FIG. 4 is a perspective view of the electronic delay turn off switch showing the external configuration.
Figure 5:
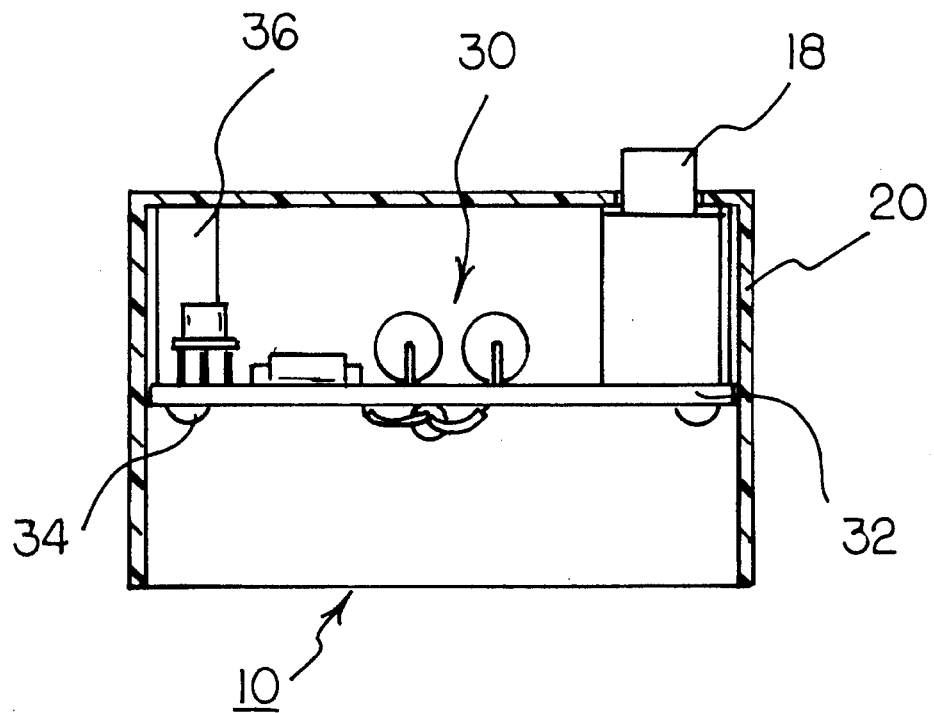
FIG. 5 is a sectional view of an electronic delay turn off switch taken substantially upon the plane indicated by the section line 5—5 of FIG. 4.
Figure 6:
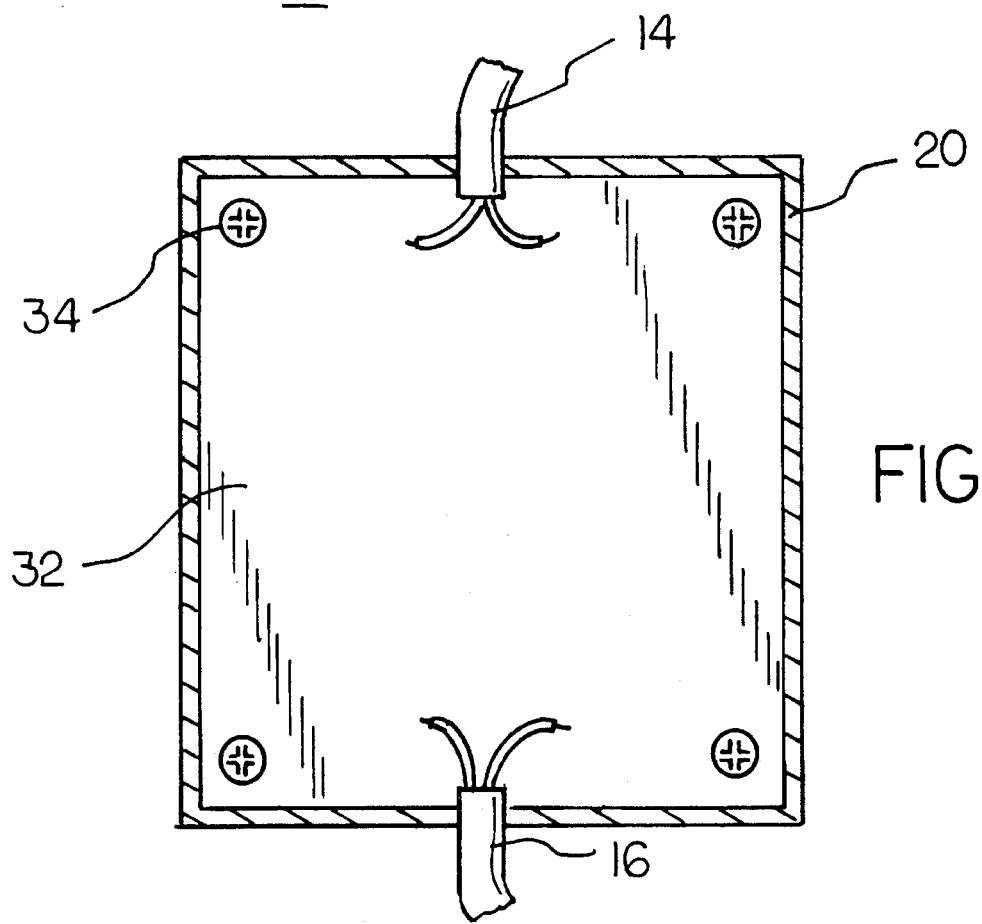
FIG. 6 is a sectional view of the electronic delay turn off switch taken substantially upon the plane indicated by the section line 6—6 of FIG. 4.

More specifically, it will be noted that the electronic delay turn off switch 10 comprises a substantially cubic housing 20 having apertures formed therein to provide manual access for switch 18, and for penetration of power delivery conductors 14 and load interconnecting conductors 16. See FIG. 4. Electronic components 0 are mounted on a printed circuit board 32 affixed to housing 20 using threaded fasteners 34 engaging standoffs 36. See FIGS. 5 and 6. Standoffs 36 may be formed as an integral part of housing 20 or be fastened thereon. Power delivery conductors 14 and load interconnecting conductors 16 are electrically connected to printed circuit board 32 and may have a fuse or circuit breaker interdisposed therein to provide protection in the event of a short circuit or component failure.

Input power is necessarily alternating current and enters circuit 40 at jacks 42 and 44. See FIG. 7. Load 46 may be an electrical light or any of a variety of alternating current powered devices and appliances. A bridgelike array of diodes 48, 50, 52, and 54 are connected to preclude electrical current flow through the load 46 except under conditions producing a conductive state of SCR 56. Switch 18 is closed for producing a continuous on state in load 46 by permitting gate biasing of SCR 56 through electrical conduction of forward biased diode 58, DIAC 60, and resistor 62. DIAC 60 is a four layer device having a low breakover voltage ranging from six volts to two hundred volts and is commonly employed to provide threshold triggering of an SCR and to prevent holdover from small persistent gate currents. Capacitor 64 and resistor 62 combine to form the initial triggering pulse when diac 60 begins conduction.

When switch 18 opens gate current does not stop flowing immediately, rather resistor 62 and capacitor 66 form an RC timer whereby capacitor 66 can only be charged through resistor 62 which derives current from the SCR 56 gate thereby maintaining SCR 56 in an on state. When capacitor 66 is fully charged no further current can flow through resistor 66 and upon receiving the next zero crossing of the input alternating current the SCR 56 ceases conduction and the load 46 is deenergized. The interval beginning when switch 18 is turned off to the moment SCR ceases conduction is the turnoff delay and is proportional to the product of the resistance of resistor 62 and the capacitance of capacitor 66.

In an alternate embodiment, variable resistor 80 is introduced to alter the RC timer time constant and thereby produce a manually selectable turn off delay ranging to about eight minutes. See FIG. 8. A knoblike dial 90 is provided on a shaft operating variable resistor 80 thereby enabling a user to select a wide range of turn off delays.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention. In as much as the present disclosure includes that contained in the appended claims as well as that of the foregoing description. Although this invention has been described in its preferred forms with a certain degree of particularity, it is understood that the present disclosure of the preferred form has been made only by way of example and numerous changes in the details of construction and combination and arrangement of parts may be resorted to without departing from the spirit and scope of the invention.

What is claimed as being new and desired to be protected by Letters Patent of the United States is as follows:

1. An electronic delay turn off switch for providing a delayed turn off of an electrical load comprising:

a primary switching circuit having two diode pairs wherein each diode has an anode and a cathode, wherein a first diode pair is electrically coupled having the anodes of the first diode pair interconnected and further connected to a cathode of an SCR and a second diode pair is electrically coupled having the cathodes of the second diode pair interconnected and further connected to an anode of the SCR, and furthermore an anode of the second diode pair and a cathode of the first diode pair connected to the load and the remaining anode of the second diode pair and cathode of the first diode pair connected to an alternating current input common;

an SCR gate control circuit comprises a series arrangement of a diode, a first capacitor whereby the first capacitor is in parallel connection with a single pole single throw switch, the series arrangement further connected to a DIAC, and a second capacitor whereby the second capacitor is connected in parallel with a resistor, and furthermore an anode of said diode is connected to the anode of the SCR and the parallel connection of said second capacitor and said resistor is connected to a gate of the SCR, the SCR gate control circuit further having a manually adjustable variable resistor connected at one end to a junction of the switch and DIAC, and at the other end to the cathode of the SCR providing a switched selectable on state and off state wherein the off state is achievable only after a preselected delay period; and a housing comprising a substantially cubic polymeric box having ports through which alternating current power lines pass and an aperture for human access to the switch.

* * * * *